(12) United States Patent
Liu et al.

(10) Patent No.: US 10,516,009 B2
(45) Date of Patent: Dec. 24, 2019

(54) DISPLAY MODULE AND DISPLAY APPARATUS THEREOF

(71) Applicant: Xiamen Tianma Micro-electronics Co., Ltd., Xiamen (CN)

(72) Inventors: Bingping Liu, Xiamen (CN); Guozhao Chen, Xiamen (CN); Xiaoxiao Wu, Xiamen (CN); Xiai Xu, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 62 days.

(21) Appl. No.: 16/016,070

(22) Filed: Jun. 22, 2018

(65) Prior Publication Data

US 2019/0267434 A1    Aug. 29, 2019

(30) Foreign Application Priority Data

Feb. 26, 2018   (CN) .......................... 2018 1 0163144

(51) Int. Cl.
| | |
|---|---|
| *H01L 27/32* | (2006.01) |
| *G02F 1/133* | (2006.01) |
| *G06K 9/00* | (2006.01) |
| *G02F 1/1333* | (2006.01) |
| *G02F 1/1345* | (2006.01) |

(Continued)

(52) U.S. Cl.
CPC ...... *H01L 27/3234* (2013.01); *G02F 1/13338* (2013.01); *G02F 1/13452* (2013.01); *G06F 1/1686* (2013.01); *G06K 9/00013* (2013.01); *G02F 1/1368* (2013.01); *G06F 1/1626* (2013.01); *H05K 2201/09172* (2013.01); *H05K 2201/10136* (2013.01)

(58) Field of Classification Search
CPC ............. H01L 27/3234; G02F 1/13338; G02F 1/13452; G06F 1/1686; G06K 9/00013
See application file for complete search history.

(56) References Cited

U.S. PATENT DOCUMENTS

| | | | |
|---|---|---|---|
| 10,437,974 B2* | 10/2019 | He ........................ | G06F 3/0412 |
| 2016/0035759 A1* | 2/2016 | Kwon ................. | H01L 27/1244 |
| | | | 257/40 |

(Continued)

FOREIGN PATENT DOCUMENTS

| | | |
|---|---|---|
| CN | 105872137 A | 8/2016 |
| CN | 106210182 A | 12/2016 |
| CN | 206164627 U | 5/2017 |

*Primary Examiner* — Utpal D Shah
(74) *Attorney, Agent, or Firm* — Anova Law Group PLLC

(57) ABSTRACT

A display module and a display apparatus are provided. The display module comprises a display panel, a fingerprint identification module and a first function module. The display panel includes a display region and a border region surrounding the display region. Along a first direction, the border region includes a first border region and an opposing second border region. The first border region includes a first recessed portion recessed towards the display region and a first extending portion extending along a second direction. The first recessed portion forms a first groove on a side of the display region adjacent to the first border region. Along a third direction, the display panel includes a first base substrate and an opposing second base substrate, the display panel also includes a through hole, and the first function module is disposed in the through hole.

20 Claims, 9 Drawing Sheets

(51) Int. Cl.
  *G06F 1/16*   (2006.01)
  *G02F 1/1368*  (2006.01)

(56) References Cited

U.S. PATENT DOCUMENTS

| | | | | |
|---|---|---|---|---|
| 2016/0224178 | A1* | 8/2016 | Yang | G06K 9/00013 |
| 2016/0260406 | A1* | 9/2016 | Seen | H04M 1/22 |
| 2017/0364187 | A1* | 12/2017 | Zhai | G02F 1/133305 |
| 2017/0371213 | A1* | 12/2017 | Wang | G06F 3/044 |
| 2017/0372113 | A1* | 12/2017 | Zhang | G02B 5/3025 |
| 2018/0005007 | A1* | 1/2018 | Du | H01L 27/3262 |
| 2018/0158877 | A1* | 6/2018 | Zeng | G06K 9/2018 |
| 2018/0307887 | A1* | 10/2018 | Han | G06K 9/0004 |
| 2019/0034020 | A1* | 1/2019 | He | G02F 1/13338 |
| 2019/0050094 | A1* | 2/2019 | Zeng | G06F 1/1626 |
| 2019/0065811 | A1* | 2/2019 | Cao | G06K 9/0004 |
| 2019/0073509 | A1* | 3/2019 | Chien | H01L 27/14623 |
| 2019/0266379 | A1* | 8/2019 | Huang | H01L 27/32 |

\* cited by examiner

DISPLAY MODULE AND DISPLAY APPARATUS THEREOF

CROSS-REFERENCES TO RELATED APPLICATIONS

This application claims priority of Chinese Patent Application No. 201810163144.7, filed on Feb. 26, 2018, the entire contents of which are hereby incorporated by reference.

FIELD OF THE INVENTION

The present disclosure generally relates to the field of display technology and, more particularly, relates to a display module and a display apparatus thereof.

BACKGROUND

Fingerprint is the unique natural pattern of ridges on tips of human fingers. With the continuous development of science and technologies, a plurality of display apparatuses, such as cell phones, tablets, and smart wearable apparatus, etc., which have the function of fingerprint identification, have been developed. Before operating a display apparatus having the function of fingerprint identification, a user only has to touch the display apparatus using a finger to verify an authorization. Thus, the authorization process is simplified.

In existing technologies, two types of display apparatus are often adopted. The first one is to dispose the fingerprint identification module on the front side of the display apparatus and, more particular, dispose at the bottom border of the display panel, which requires the bottom border of the display panel to have a certain width, and does not facilitate to increase the screen-to-body ratio. The second one is to dispose the fingerprint identification module on the back side of the display apparatus, which may lead to a convenient operation and degrade the user experience.

As full-screen display apparatuses are emerging, developers have been continuously exploring various types of full screens, however, the design of the front-side/front-face fingerprint identification has become one of the technical challenges.

Thus, a display module and a display apparatus capable of realizing a front-facing fingerprint identification are highly desired in the field of display technology. The disclosed display module and display apparatus are directed to solve one or more problems set forth above and other problems in the art.

BRIEF SUMMARY OF THE DISCLOSURE

One aspect of the present disclosure provides a display module. The display module includes a display panel including a display region and a border region surrounding the display region. The border region includes a first border region and a second border region arranged opposite to the first border region along a first direction, the first border region includes a first recessed portion recessed toward the display region and a first extending portion extending along a second direction, and the display region includes a first side adjacent to the first border region and an opposing second border region far away from the first border region, and the first recessed portion forms a first groove at the first side of the display region. The display module also includes a fingerprint identification module and a first function module including at least one of a camera module and a headphone module. The display panel includes a first base substrate and a second base substrate arranged opposite to the first base substrate along a third direction. The first base substrate includes a fingerprint region and a pixel region, an orthogonal projection of the first groove onto the first base substrate covers the fingerprint region, and an orthogonal protection of the display region onto the first base substrate overlaps with the pixel region. The display panel also includes a through hole penetrating the display panel along the third direction, and the first function module is disposed in the through hole.

Another aspect of the present disclosure provides a display apparatus. The display apparatus includes a display module. The display module includes a display panel including a display region and a border region surrounding the display region. The border region includes a first border region and a second border region arranged opposite to the first border region along a first direction, the first border region includes a first recessed portion recessed toward the display region and a first extending portion extending along a second direction, and the display region includes a first side adjacent to the first border region and an opposing second border region far away from the first border region, and the first recessed portion forms a first groove at the first side of the display region. The display module also includes a fingerprint identification module and a first function module including at least one of a camera module and a headphone module. The display panel includes a first base substrate and a second base substrate arranged opposite to the first base substrate along a third direction. The first base substrate includes a fingerprint region and a pixel region, an orthogonal projection of the first groove onto the first base substrate covers the fingerprint region, and an orthogonal protection of the display region onto the first base substrate overlaps with the pixel region. The display panel also includes a through hole penetrating the display panel along the third direction, and the first function module is disposed in the through hole.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
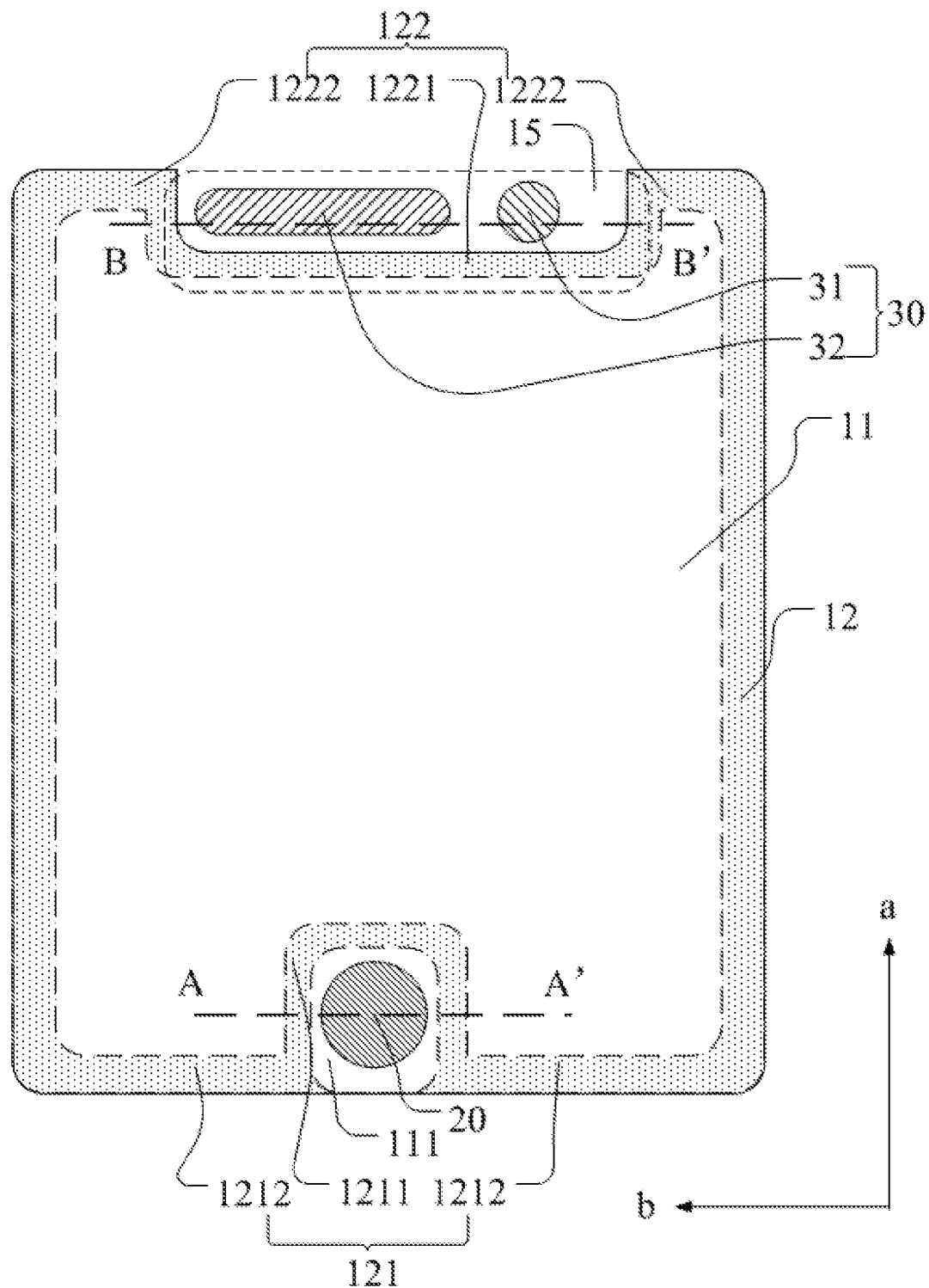
FIG. 1 illustrates a top view of an exemplary display module consistent with various disclosed embodiments.

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present disclosure. Based on the disclosed embodiments, persons of ordinary skill in the art may derive other embodiments consistent with the present disclosure, all of which are within the scope of the present invention. Further, in the present disclosure, the disclosed embodiments and the features of the disclosed embodiments may be combined under conditions without conflicts.

The techniques, methods and apparatus that are familiar to the persons of ordinary skill in the art may not be described in detail. However, under appropriate conditions, such techniques, methods and apparatus are included as the parts of the description.

In the disclosed embodiments, the specific values should be explained for illustrative purposes only and should not be used as limitations. Thus, some other embodiments may have different values.

Further, the similar symbols and letters in the drawings denote similar elements. Thus, once one element is defined in one drawing, it may not need to be defined in the following drawings.

The present disclosure provides a display module capable of realizing front-facing fingerprint identification in a full screen display module.

FIG. 1 illustrates a top view of an exemplary display module consistent with various disclosed embodiments. As shown in FIG. 1, the display module may include a display panel 10, a fingerprint identification module 20, a first function module 30, and a cover plate 40 disposed a light-emitting side of the display module. The fingerprint identification module 20 may be integrated inside the display panel 10. When a user touches a position of the surface of the cover plate 40 corresponding to the fingerprint identification module 20, the fingerprint identification module 20 may be triggered to perform a fingerprint identification.

In one embodiment, the first function module 30 may include a camera module 31 and/or a headphone module 32. In another embodiment, the function module 30 may further include other function modules. Further, the function module 30 may include any appropriate function modules, and the number and the type of the function modules included in the first function modules 30 are not limited by the present disclosure.

In particular, the display panel 10 may include a display region 11 for displaying images and a border region 12 surrounding the display region 11. Certain lines of the display panel 10 (such as data lines, scanning lines) and the encapsulation structure of the display panel 10 may be disposed at the border region 12.

Along a first direction a, the border region 12 may include a first border region 121 and an opposing second border region 122. The first border region 121 may include a first recessed portion 1211 and a first extending portion 1212. The display region 11 may have a first side adjacent to the first border region 121 and an opposing second side far away from the first border region 121. The first recessed portion 1211 may be recessed toward the display region 11 so as to form a groove, i.e., a first groove 111, at the first side of the display region 11. At the position of the first groove 111, the display region 11 may not display any images. The first extending portion 1212 may extend along a second direction b. In one embodiment, the first direction a may cross the second direction b, and the first direction a and the second direction b may be both parallel to a plane where the display panel is located.

Figure 2:
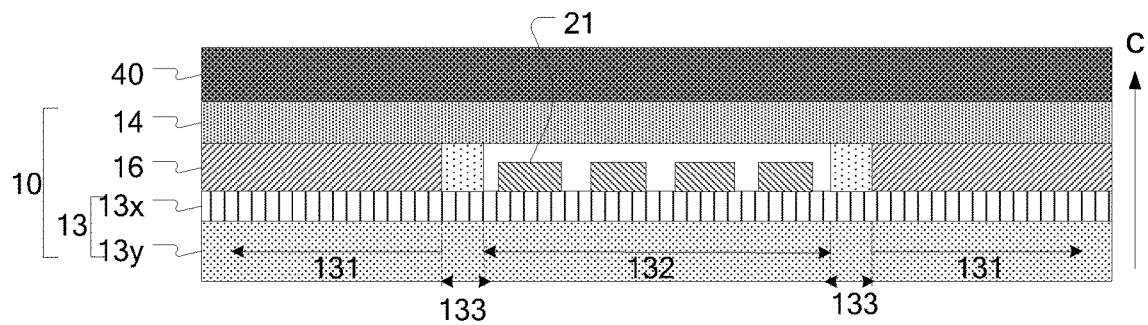
FIG. 2 illustrates a cross-sectional view of an exemplary display module consistent with various disclosed embodiments.
Figure 3:
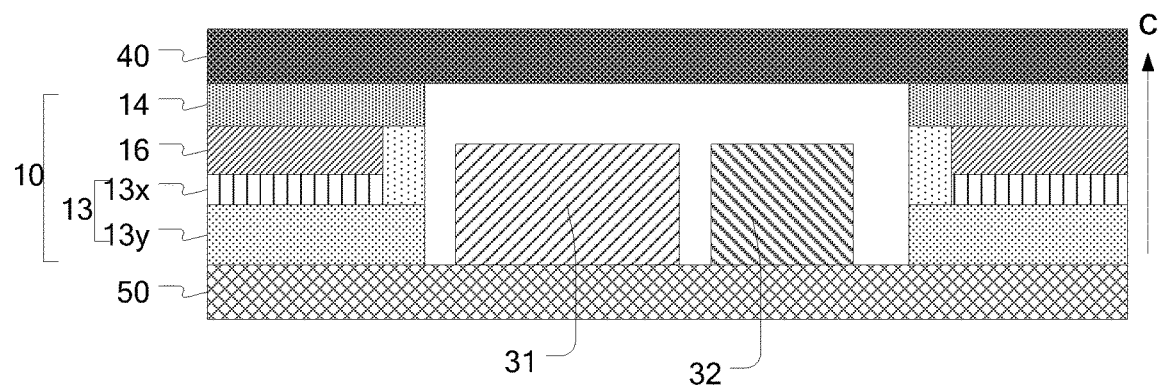
FIG. 3 illustrates another cross-sectional view of an exemplary display module consistent with various disclosed embodiments.

FIGS. 2-3 are cross-sectional views of an exemplary display module consistent with various disclosed embodiments. In particular, FIG. 2 is an A-A'-sectional view in FIG. 1, and FIG. 3 is a B-B'-sectional view in FIG. 2.

As shown in FIGS. 1-3, the display panel 10 may include a first base substrate 13. Along a third direction c, the display panel 10 may also include a second base substrate 14 arranged opposite to the first base substrate 13. Further, the display panel 10 may include a display layer 16 between the first base substrate 13 and the second base substrate 14. The display layer 16 may be disposed on the display region 11. The third direction c may be perpendicular to both the first direction a and the second direction b.

The first base substrate 13 may include a fingerprint region 131, a pixel region 132 and an edge region 133. The fingerprint identification module 20 may include a plurality of fingerprint identification sensors 21, through which the display module may obtain a fingerprint image. The plurality of fingerprint identification sensors 21 may be disposed in the fingerprint region 131.

The orthogonal projection of the first groove 111 onto the first base substrate 13 may cover the fingerprint region 131. That is, the plurality of fingerprint identification sensors 21 may be located at the position of the first groove 111 of the display region 11, without being overlapped with the display region 11. The fingerprint region 131 may only be used to obtain a fingerprint image, rather than displaying any images. The orthogonal projection of the first groove 111 on the first base substrate and the fingerprint region 121 in the first base substrate each may have a circular, triangular, other regular shape, or irregular shape.

The pixel region 132 may overlap with the orthogonal projection of the display region 11 onto the first base substrate 13. That is, the display layer 16 may be disposed in the pixel region 132. The edge region 133 may overlap with the orthogonal projection of the border region 12 onto the first base substrate 13. The border region 12 may not be disposed with any display pixels. The border region 12 may not be used for fingerprint identification, however, packaging/encapsulation structures may be disposed in the border region 12 to realize an encapsulation of the second base substrate 14.

Along the third direction c, the display panel 10 may also include a through hole 15 penetrating through the display panel 10. At the position of the through hole 15, the first base substrate 13 and the second base substrate 14 may all be penetrated through. The first function module 30 may be disposed in the through hole 15. In one embodiment, as shown in FIG. 3, the first function module 30 may be fixed on a shell 50 of the display apparatus.

The display panel 16 may include any appropriate display elements for displaying images. According to different types of the display elements, the display panel 10 may be a plasma display panel, a field emission display panel, a light-emitting diode (LED) display panel, an organic light-emitting diode (OLED) display panel, a liquid crystal display panel, a quantum dots (QDs) display panel, an electrophoretic display panel, etc. Further, the display panel 10 may be any appropriate type of display panels which are not limited by the present disclosure.

In one embodiment, the display panel may be a LCD panel, and the display layer 16 may include liquid crystal molecules. The liquid crystal molecules may be disposed in the display region 11. The first base substrate 13 may be an array substrate, and the second base substrate 14 may be a color film substrate. In another embodiment, the first base substrate 13 may be a color film substrate, and the second base substrate 14 may be an array substrate.

Taking the first base substrate 13 being an array substrate and the second base substrate 14 being a color film substrate as an example, the first base substrate 13 may include a substrate layer 13y and a film layer structure 13x disposed on the substrate layer 13y. The film layer structure 13x may include multiple conductive layers for forming devices including thin-film transistors and signal lines, and multiple insulation layers disposed between the conductive layers. The detailed information is omitted here.

The film layer structure of the first base substrate 13 in FIG. 3 is only for illustrative purposes, and is not intended to limit the scope of the present disclosure. In one embodiment, the film layer structure 13x may comprise a first portion located in the pixel region 132, a second portion located in the fingerprint region 131, and a third portion located in the edge region 133. The first portion of the film layer structure 13x may be disposed with circuits and devices for controlling pixels, the second portion of the film layer structure 13x may be disposed with circuits and devices for controlling the fingerprint identification, the third portion of the film layer structure 13x may be disposed with circuits and devices of the peripheral circuit and driving circuit. Further, an adhesive layer may be disposed on the edge region 132 to achieve an adhesion between the first base substrate 13 and the second base substrate 14.

In another embodiment, the display pane may be an organic light-emitting display panel, and the display layer 16 may include organic light-emitting devices. The organic light-emitting devices may be disposed in the display region 11. In one embodiment, the first base substrate 13 may be an array substrate, and the second base substrate 14 may be a cover plate. In another embodiment, the first base substrate 12 may be a cover plate, and the second base substrate 14 may be an array substrate. For a rigid organic light-emitting display panel, the cover plate may be a glass cover plate. For a flexible organic light-emitting display panel, the cover plate may be a thin film encapsulation layer.

Taking the first base substrate 13 being an array substrate and the second base substrate 24 being a cover plate as a sample, the dispositions of the layer structures of the different areas of the first base substrate 13 may be similar to the dispositions of the layer structures of the different areas of the previously described first base substrate in the LCD display panel. For a flexible organic light-emitting display panel, when a thin film encapsulation layer is used as the cover plate to achieve the encapsulation, a bank of the thin film encapsulation structure may be disposed at the edge region 133 without any adhesive.

No matter the LCD panel or the organic light-emitting panel, when the first base substrate is an array substrate, the circuits and devices for controlling the pixels, as well as, the circuits and devices for controlling the fingerprint identification may be all routed at the first base substrate. Thus, the process for routing the circuits and devices for controlling the displaying pixels and the process for routing the circuits and devices for controlling the fingerprint identification may be shared, which may prevent extra processes for fabricating the display panel when the fingerprint identification module is integrated into the display panel.

In the disclosed embodiments, on one hand, the through hole may be disposed in the display panel, a clearance space may be provided to dispose the function modules, such as the headphone module and the camera module, etc. On the other hand, the display region of the display panel may be irregularly designed, i.e., have an irregular shape, such that a portion of the border region may be recessed into the display region, and a groove may be formed at a side of the display region in which the side of the display is adjacent to the border region. The fingerprint identification sensors may be disposed in the region where the groove is located, thereby integrating the fingerprint identification module in the display panel.

At the same time, the front-facing fingerprint identification may be achieved, i.e., the fingerprint identification module may be able to be disposed at the front face of the display module. The headphone module, the camera module and the fingerprint identification module may not be disposed on the border of the display module, through which the border of the display module may be reduced, and a full screen may be achieved. Thus, in the disclosed embodiments, the full screen may be achieved and, meanwhile, the fingerprint identification module may be able to be disposed at the front face of the display module. That is, the front-facing fingerprint identification may be achieved and, accordingly, and the user experience may be improved.

In one embodiment, when the fingerprint identification module is obtaining a fingerprint image, an optical data acquisition method may be used. In particular, the fingerprint identification module may include a light source and a plurality of fingerprint identification sensors. The fingerprint identification sensors may perform a fingerprint identification according to the light emitting from the light source and reflected by the touching body (TB).

In one embodiment, the light source of the fingerprint identification module may be independent of the display pixels, i.e., merely used for the fingerprint identification. The light source may be embedded in the display panel. For example, for an organic light-emitting display panel, the light source may be a light-emitting device disposed in the first groove. The light-emitting device disposed in the first groove and the organic light-emitting device in the display region may be disposed on a same layer. However, the light-emitting device deposed in the first groove may only provide light during the fingerprint identification, but not be used to display images. In another embodiment, the light source of the fingerprint identification module may be multiplexed as the light source of the display pixels. For example, in an LCD panel, the light source of the fingerprint identification module may also be multiplexed as the backlight source of the display module.

Figure 4:
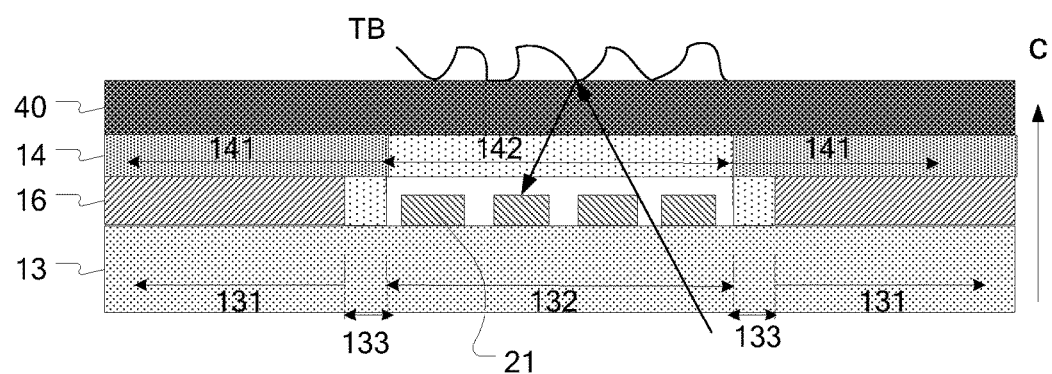
FIG. 4 illustrates a cross-sectional view of another exemplary display module consistent with various disclosed embodiments.

FIG. 4 illustrates a cross-sectional view of another exemplary display module consistent with various disclosed embodiment. In particular, FIG. 4 is an A-A'-sectional view of the display module in FIG. 1. As shown in FIG. 1 and FIG. 4, the second base substrate 14 may include a transparent region 142 and a non-transparent region 141. The orthogonal projection of the first groove 111 onto the second base substrate 14 may cover the transparent region 142. Certain film structures, such as a color barrier film and a black matrix film, etc., may be disposed on the non-transparent region 141. However, the transparent region 142 may be free of the color barrier film and the black matrix film. The light transmittance of the transparent region 142 may be greater than the light transmittance of the non-transparent region 141.

Figure 5:
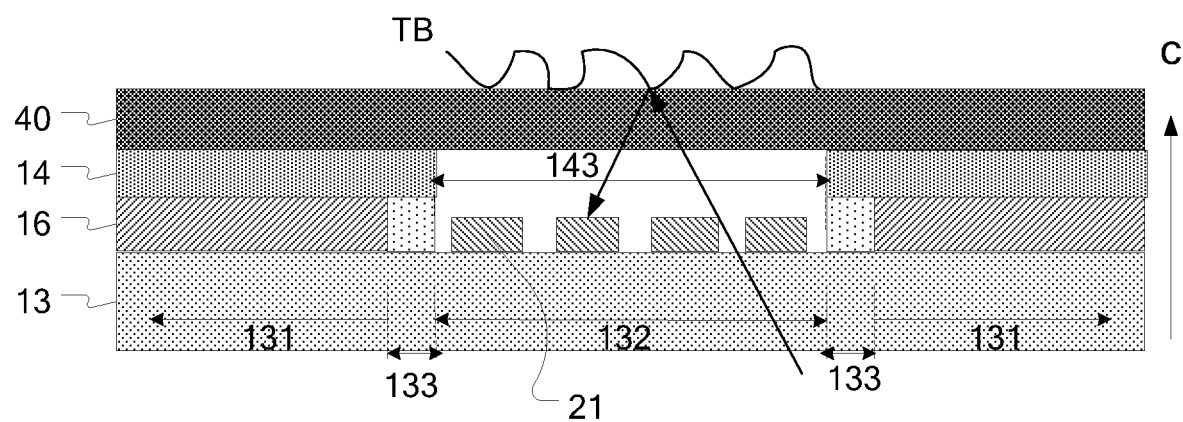
FIG. 5 illustrates a cross-sectional view of another exemplary display module consistent with various disclosed embodiments.

FIG. 5 illustrates a cross-sectional view of another exemplary display module consistent with various disclosed embodiments. In particular, FIG. 5 is another A-A'-sectional view of the display module in FIG. 1. As shown in FIG. 1 and FIG. 5, along a third direction c, the second base substrate 14 may have a first notch 143 penetrating through the second base substrate 14. The orthogonal projection of the first groove 111 onto the second base substrate 14 may cover the first notch 143.

For the fingerprint identification module 20 based on the optical data acquisition principle, as shown in FIGS. 4-5, after the light emitted from the light source (not shown) of the fingerprint identification module is incident onto the touching body (TB), the light may be reflected back to the fingerprint identification sensors by the interface between the touching body (TB) and the cover plate 40. The display module may obtain the fingerprint image according to the reflected light received by the fingerprint identification sensors 21.

No matter the light source of the fingerprint identification module 20 is integrated in the display panel or attached to the display panel, the light incident onto the touching body (TB) and the light reflected by the touching body (TB) to the fingerprint identification sensors 21 may both pass through a region of the second substrate 14 where the orthogonal protection of the first groove 11 onto the second substrate 14 is located. Thus, as shown in FIG. 4, through configuring the region of the second substrate 14 where the orthogonal protection of the first groove 11 onto the second substrate 14 is located to be the transparent region 142, or as shown in FIG. 5, through configuring the region of the second substrate 14 where the orthogonal protection of the first groove 11 onto the second substrate 14 is located to be the first notch 143, the loss of the light passing through the transparent region 142 may be reduced. Accordingly, the intensity of the light received by the fingerprint identification sensors 21 may be increased, and the accuracy of the fingerprint identification may be improved.

In the disclosed embodiments, through configuring the region of the second substrate 14 where the orthogonal protection of the first groove 11 onto the second substrate 14 is located to be the transparent region 142, or directly cut the region of the second substrate 14 where the orthogonal protection of the first groove 11 onto the second substrate 14 is located to form the first notch 143, the light loss during the fingerprint identification may be reduced. Accordingly, the accuracy of the fingerprint identification may be improved.

Figure 6:
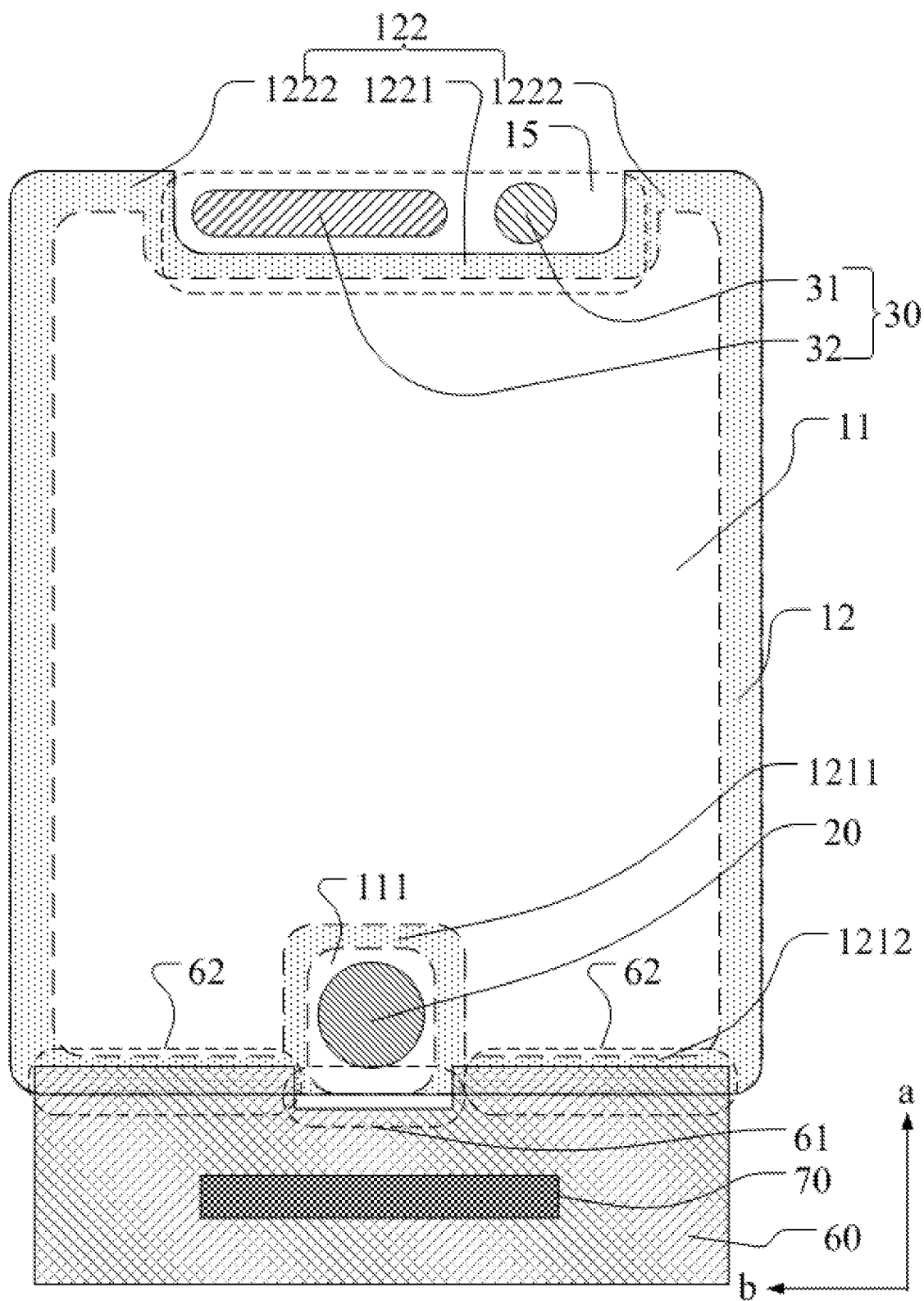
FIG. 6 illustrates a top view of another exemplary display module consistent with various disclosed embodiments.

FIG. 6 illustrates a top view of another exemplary display module consistent with various disclosed embodiments. The similarities between FIG. 1 and FIG. 6 are not repeated here, while certain differences may be explained.

As shown in FIG. 6, the display module may also include a flexible circuit board 60 and an integrated circuit (IC) chip 70. The IC chip 70 may provide the driving signals for the display panel to display images. The IC chip 70 may be disposed on the flexible circuit board 60 to form a chip-on-film (COF) structure, thereby further reducing the border of the display panel and further facilitating a full screen. The fingerprint identification module 20 may have a control portion for realizing the fingerprint identification. In one embodiment, the control portion of the fingerprint identification module 20 may be integrated in the IC chip 70, and in another embodiment, the control portion of the fingerprint identification module 20 may be an independent chip disposed at the flexible circuit board 60.

The flexible circuit board 60 may include a connection portion, through which the flexible circuit board 60 may be bonded to a first extending portion 1212 of the display panel 10. The flexible circuit board 60 may transmit signals between the display panel 10 and a main control chip of the display apparatus. When the display module is installed in the shell of the display apparatus, the flexible circuit board 60 may be bent to the back of the display panel 10. For example, the first base substrate may have first side adjacent to the second base 14 substrate and an opposing second side far away from the second base substrate 14, and the flexible circuit board 60 may be bent to the second side of the first base substrate.

In the disclosed embodiments, the IC chip and the flexible circuit board may be integrated in a COF structure. Thus, the width of the border of the display panel may be reduced, and the screen-to-body ratio of the display apparatus may be increased.

In one embodiment, as shown in FIG. 1 and FIG. 6, along the second direction b, the first recessed portion 1211 may be located at the middle of the first border region 121. The first extending portion 1212 may be divided into two parts by the first groove 111, and the two parts may be extending along the second direction b.

In the existing display apparatus having a front-facing fingerprint identification, the fingerprint identification region is often disposed at the middle of the bottom border. However, in the disclosed embodiments, the first recessed portion 1211 may be disposed at the middle of the first border region 121. Thus, along the second direction b, the fingerprint identification module 20 may be located at the middle of the display panel 10. Accordingly, the position of the fingerprint identification region on the disclosed display panel may be similar or same as the position of the fingerprint identification region on the existing display panel, which may fit the fingerprint identification habits that the user gets used to, and the user experience may be improved.

In the disclosed embodiments, the full screen may be achieved, meanwhile, the fingerprint identification module may be able to be disposed at the first face of the display module. That is the front-facing fingerprint identification may be achieved. Further, the display module may fit the fingerprint identification habits the user get used to, and the user experience.

In another embodiment, referring to FIG. 1, along the second direction b, the flexible circuit board 60 may include a second notch 61 located at the middle of the flexible circuit board 60, and first connection portions 62 located at both sides of the second notch 61. Along the first direction a, the second notch 61 may be arranged opposite to the first groove 111. The first connection portion 62 may be bonded on the first extending portion 1212.

In the disclosed embodiments, according to the position of the first groove, a notch may be disposed on the region where the flexible circuit board and the display region are bonded. The connection portions may be disposed at two sides of the notch to bond the flexible circuit board with the display region. Thus, the signals to the display panel provided by the integrated circuit chip on the flexible circuit board may be transmitted to the display panel through the connect portions and the signal lines disposed in the bonding region on the display panel as much as possible. Accordingly, the wire winding may be reduced as much as possible.

Figure 7:
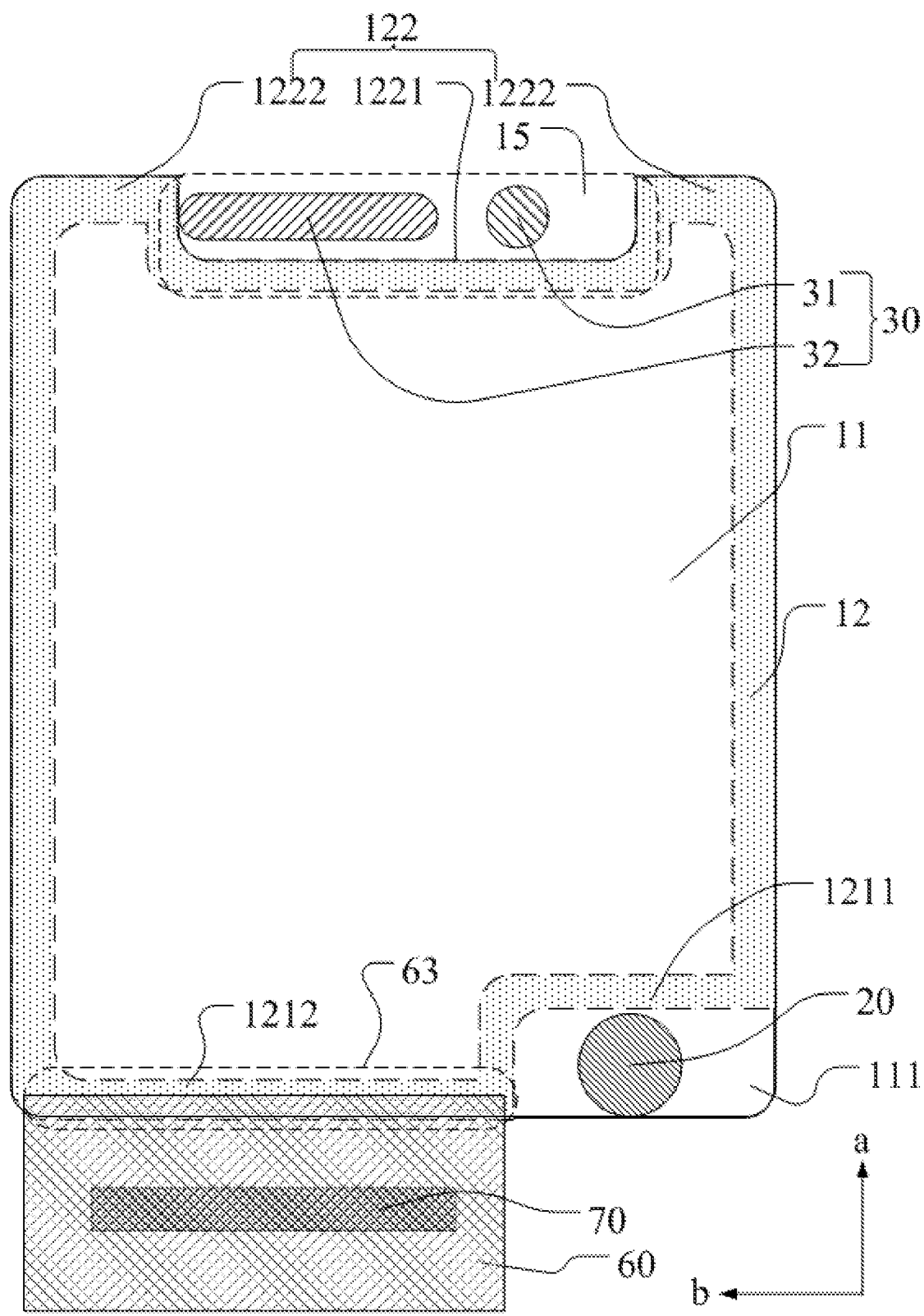
FIG. 7 illustrates a top view of another exemplary display module consistent with various disclosed embodiments.

FIG. 7 illustrates a top view of another exemplary display module consistent with various disclosed embodiments. The similarities between FIG. 1 and FIG. 7 are not repeated here, while certain differences may be explained.

As shown in FIG. 7, in one embodiment, along the second direction b, the first recessed portion 1211 may be located at one end of the first border region 121. The first extending portion 1212 may be located at the other end of the first border region 121.

In the disclosed embodiments, the first recessed portion may be located at one end of the first border region. That is, the notch of the display region on the display panel, i.e., the first groove, may be disposed at a corner region of the display panel. Along the first direction a and the second direction b, the display region may be both continuous, which may facilitate to display a complete image.

In another embodiment, referring to FIG. 7, along the second direction b, the flexible circuit board 60 may include an extending second connection portion 63. The second connection portion 63 may be a continuous portion. The second connection portion 63 may be bonded to the first extending portion 1212.

In the disclosed embodiments, the flexible circuit board may not need to be cut. Thus, the fabrication method may be substantially simple, and the fabrication process of the flexible circuit board may be simplified.

Figure 8:
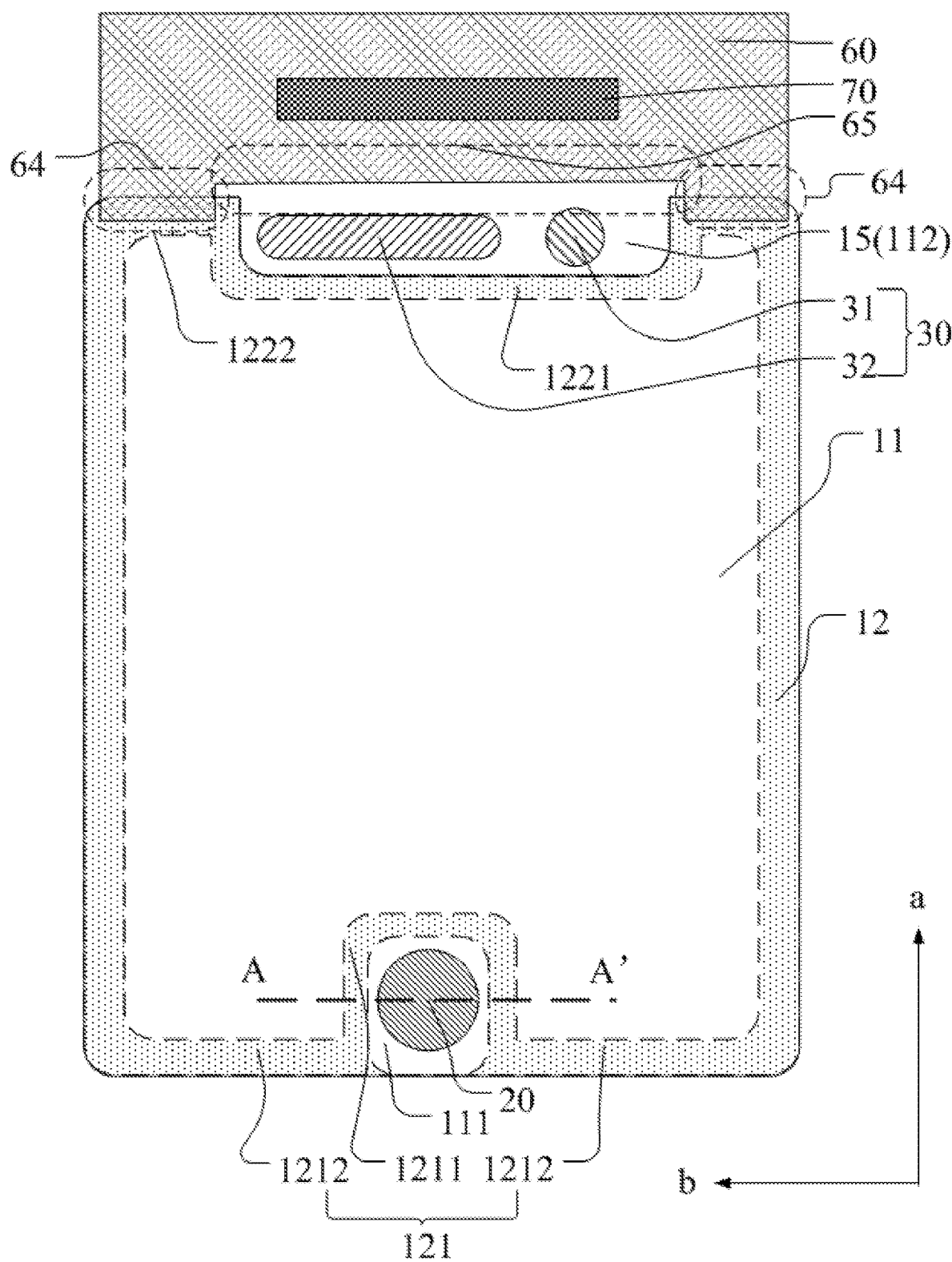
FIG. 8 illustrates a top view of another exemplary display module consistent with various disclosed embodiments.

FIG. 8 illustrates a top view of another exemplary display module consistent with various disclosed embodiments. The similarities between FIG. 1 and FIG. 8 are not repeated here, while certain differences may be explained.

As shown in FIG. 1 and FIG. 8, the second border region 122 may include a second recessed portion 1221 recessed toward the display region 11 and a second extending portion 1222 extending along the second direction b. The display region 11 may have a first side adjacent to the second border region 122 and an opposing second side far away from the second border region 122. The second recessed portion 1221 may form a second groove 112 on the first side of the display region 11. The through hole 15 may be disposed in second groove 112.

In the disclosed embodiments, the through hole used to dispose the camera module and/or the headphone module may be disposed at the position adjacent to the border region, which may be convenient for the signal line layout.

In another embodiment, as shown in FIG. 8, the display module may also include a flexible circuit board 60 and the integrated circuit chip 70. The IC chip 70 may provide the driving signals for the display panel to display images. The IC chip 70 may be disposed on the flexible circuit board 60 to form a chip-on-film (COF) structure, thereby further reducing the border of the display panel, and further facilitating a full screen. The fingerprint identification module 20 may have a control portion for realizing the fingerprint identification. In one embodiment, the control portion of the fingerprint identification module 20 may be integrated in the IC chip 70. In another embodiment, the control portion of the fingerprint identification module 20 may be an independent chip disposed at the flexible circuit board 60.

The flexible circuit board 60 may include a connection portion, through which the flexible circuit board 60 may be bonded to the second extending portion 1222 of the display panel 10. The flexible circuit board 60 may transmit signals between the display panel 10 and a main control chip of the display apparatus. When the display module is installed in the shell of the display apparatus, the flexible circuit board 60 may be bent to the back of the display panel 10. For example, the first base substrate may have first side adjacent to the second base substrate and an opposing second side far away from the second base substrate, and the flexible circuit board 60 may be bent to the second side of the first base substrate.

When the flexible circuit board 60 is bonded to the second extending portion 1222, as shown in FIG. 8, the first recessed portion 1211 may be disposed at the middle of the first border region 121 along the second direction b. In another embodiment, as shown in FIG. 7, along the second direction b, the first recessed portion 1211 may be disposed on one end of the first border region 121. In particular, as shown in FIG. 7, the first recessed portion 1211 may be disposed on the right end of the first border region 121. In another embodiment, the first recessed portion 121 may be disposed on the left end of the first border region 121.

In the disclosed embodiments, the IC chip and the flexible circuit board may be integrated in a COF structure. The width of the border of the display panel may be reduced, and the screen-to-body ratio of the display apparatus may be increased.

In one embodiment, as shown in FIG. 1 and FIG. 8, along the second direction b, the second recessed portion 1221 may be located at the middle of the second border region 122. The second extending portion 1222 may be divided into two parts by the second notch 112, and the two parts may be extending along the second direction b.

Figure 9:
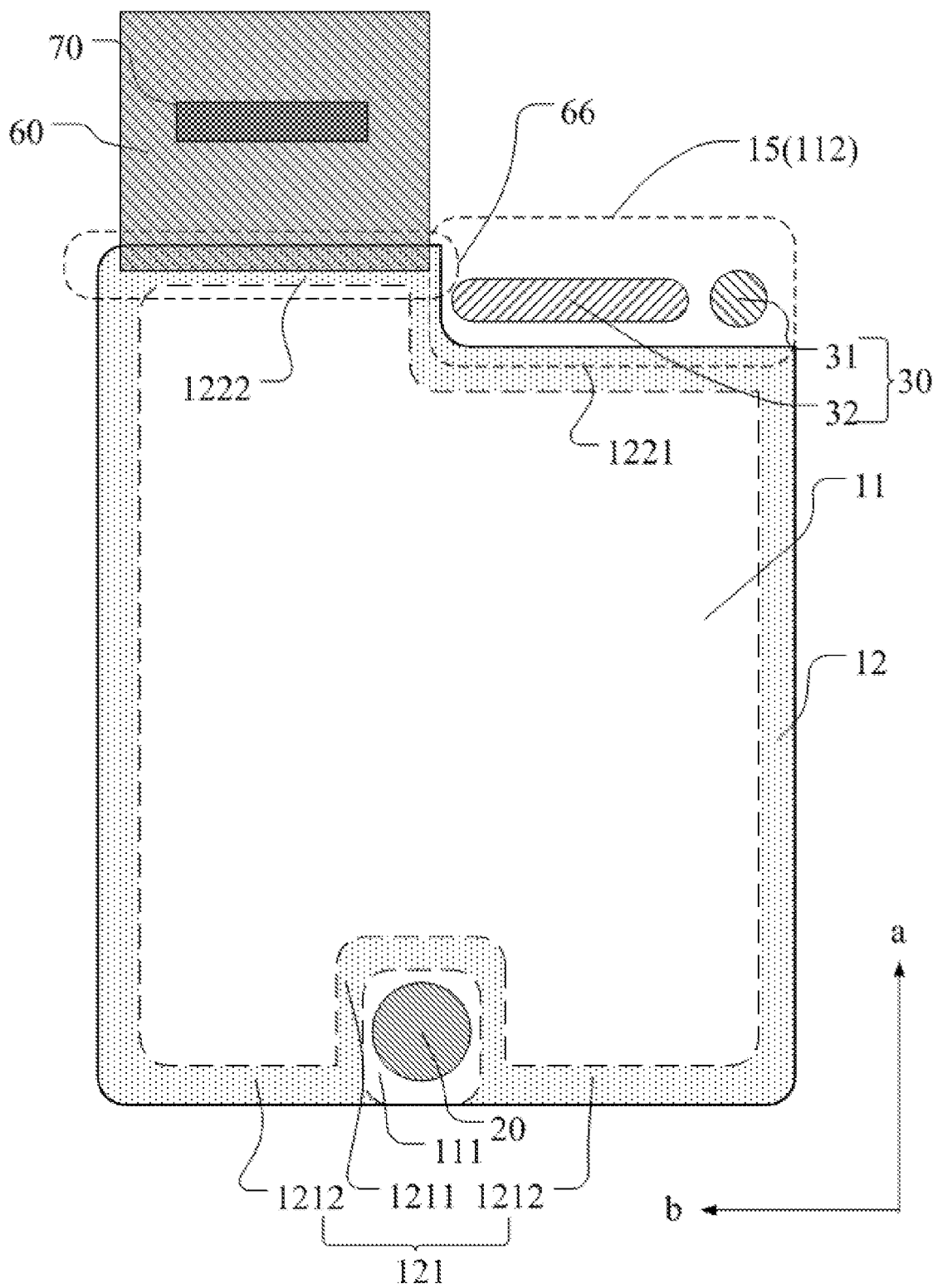
FIG. 9 illustrates a top view of another exemplary display module consistent with various disclosed embodiments.

FIG. 9 illustrates top view of another exemplary display module consistent with various disclosed embodiments. The similarities between FIG. 1 and FIG. 9 are not repeated here, while certain differences may be explained.

As shown in FIG. 9, in one embodiment, along the second direction b, the second recessed portion 1221 may be located on one end of the second border region 122, the second extending portion 1222 may be located on the other end of the second border region 122. The notch of the display region 11, i.e., the second groove 112 may be located at one corner region of the display panel. Along the first direction a and the second direction b, the display region 11 may be both continuous, which may facilitate to display a complete image.

In another embodiment, as shown in FIG. 9, the flexible circuit board 60 may include a fourth connection portion 66 extending along the second direction b. The fourth connection portion 66 may be a continuous portion, and may be bonded to the second extending portion 1222.

Figure 10:
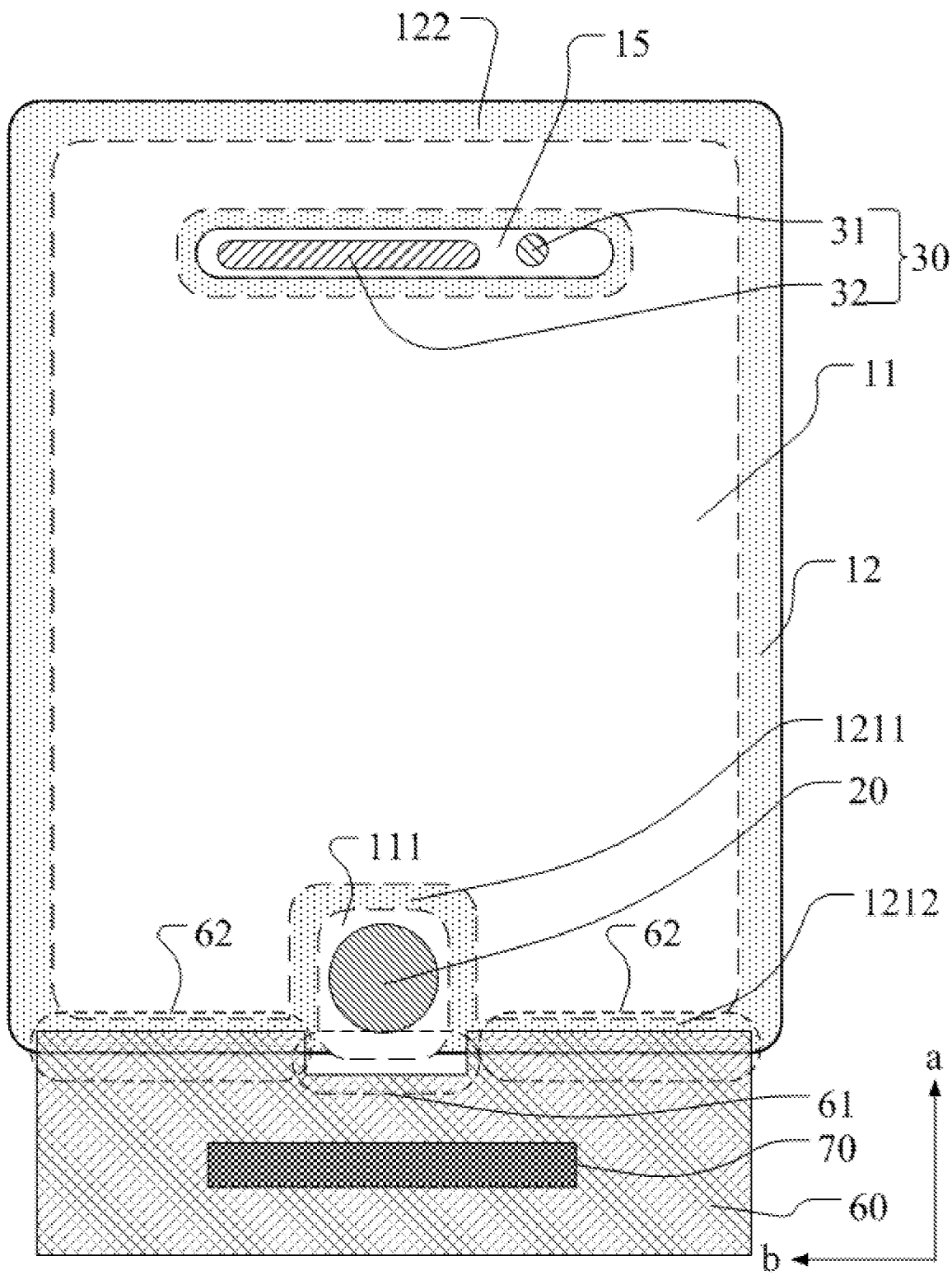
FIG. 10 illustrates a top view of another exemplary display module consistent with various disclosed embodiments.

FIG. 10 illustrates a top view of another exemplary display module consistent with various disclosed embodiments. The similarities between FIG. 1 and FIG. 10 are not repeated here, while certain differences may be explained.

As shown in FIG. 10, the middle of the display panel 10 may be cut through to form a through hole enclosed by the display region 11 to form the through hole 15 for disposing a first function module 30. The flexible circuit board 60 may be bonded to the first border region 1212. When the through hole 15 is disposed at the middle of the display panel, as shown in FIG. 10, the first recessed portion 1211 may be disposed at the middle of the first border region 1212 along the second direction b. In another embodiment, as shown in FIG. 7, along the second direction b, the first recessed portion 1211 may be disposed at one end of the first border region 121. In one embodiment, as shown in FIG. 7, the first recessed portion 1211 may be disposed at the right end of the first border region 121. In another embodiment, the first recessed portion 1211 may be disposed at the left end of the first border region 121.

Figure 11:
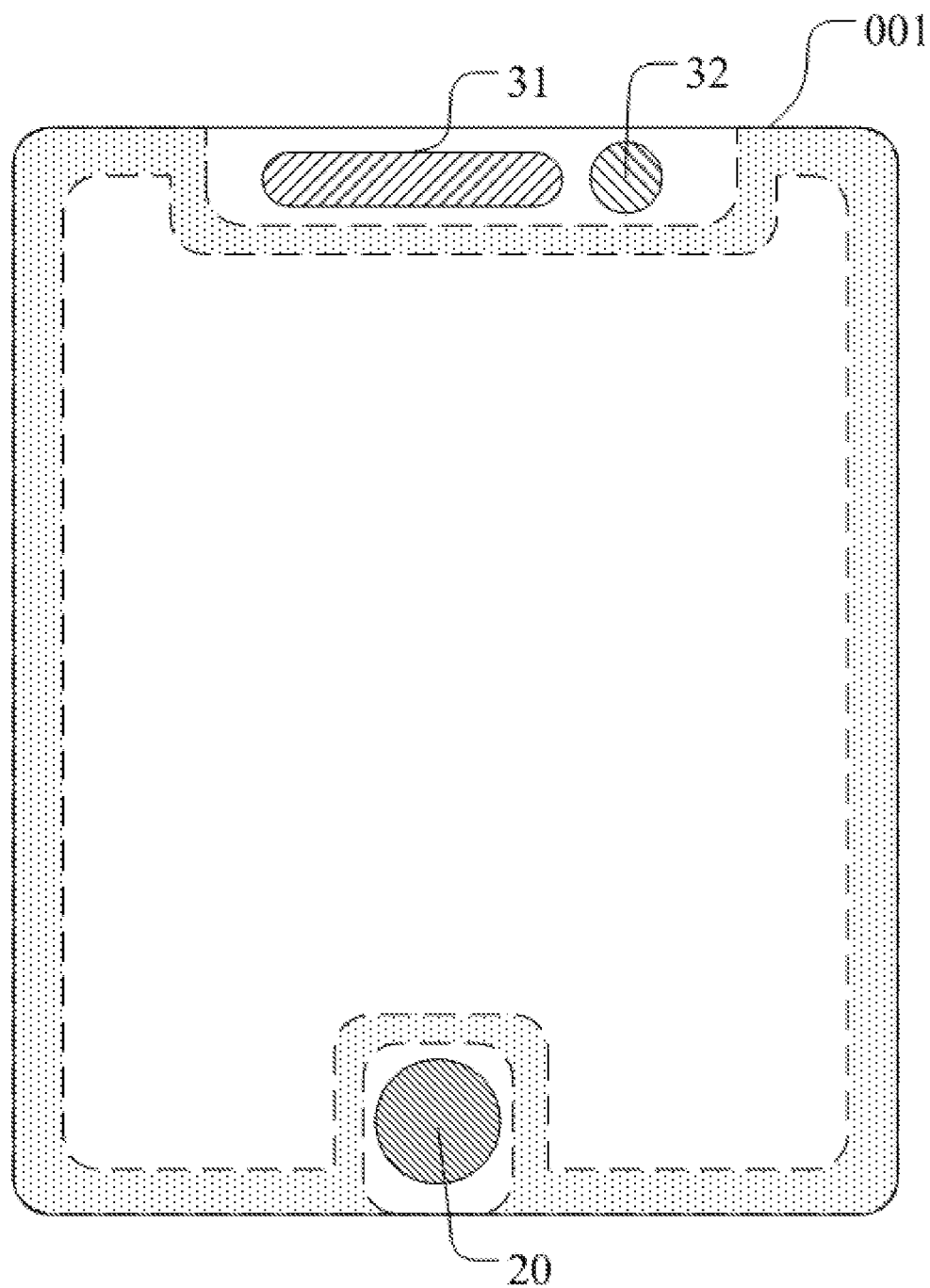
FIG. 11 illustrates an exemplary display apparatus consistent with various disclosed embodiments.

The present disclosure also provides a display apparatus. FIG. 11 illustrates an exemplary display apparatus consistent with various disclosed embodiments. The display apparatus may include a disclosed display module or other appropriate display modules. The characteristics and technical effects of the disclosed display module are described previously.

As shown in FIG. 11, the display apparatus 011 may be any appropriate portable electronic display apparatus, such a cell phone, or a tablet computer, etc. A camera module 31, a headphone module 32 and a fingerprint identification module 20 may be disposed on the front side of the display apparatus 001.

In the disclosed embodiments, nn one hand, a through hole may be disposed in the display panel to doge a space to dispose certain function modules, such as a headphone module and a camera module, etc. On the other hand, the display region of the display panel may be irregularly designed to cause a portion of a border region to be recessed towards the display region to form a groove on a region of the display region adjacent to the border region. A fingerprint identification unit may be disposed in the region where the groove is located so as to integrate the fingerprint identification unit into the display panel. Thus, a front-facing fingerprint identification unit may be achieved. Further, it may not need to dispose the function modules, such as the headphone module and the camera module and the fingerprint identification module in the border region of the display module. Thus, the border of the display module may be reduced, and a full screen may be achieved, meanwhile, the fingerprint identification module may be able to be disposed at the front face of the display module. That is, the front-facing fingerprint identification may be achieved and, accordingly the user experience may be improved.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A display module, comprising: a display panel including a display region and a border region surrounding the display region, wherein:
the border region includes a first border region and a second border region arranged opposite to the first border region along a first direction, the first border region includes a first recessed portion recessed toward the display region and a first extending portion extending along a second direction, and
the display region includes a first side adjacent to the first border region and an opposing second side far away from the first border region, and the first recessed portion forms a first groove at the first side of the display region;
a fingerprint identification module; and
a first function module including at least one of a camera module and a headphone module,
wherein:
the display panel includes a first base substrate and a second base substrate arranged opposite to the first base substrate along a third direction,
the first base substrate includes a fingerprint region and a pixel region, an orthogonal projection of the first groove onto the first base substrate covers the fingerprint region, and an orthogonal projection of the display region onto the first base substrate overlaps with the pixel region, and
the display panel includes a through hole penetrating the display panel along the third direction, and the first function module is disposed in the through hole.

2. The display module according to claim 1, wherein:
the first direction crosses the second direction, and the first direction and the second direction are both parallel to a plane where the display panel is located,
the third direction is perpendicular to both the first direction and the second direction, and
the fingerprint identification module includes a plurality of fingerprint identification sensors disposed in the fingerprint region.

3. The display module according to claim 2, wherein:
the second base substrate further comprises a transparent region, and
an orthogonal projection of the first groove onto the second base substrate covers the transparent region.

4. The display module according to claim 2, wherein:
the second base substrate further comprises a first notch penetrating through the second base substrate along the third direction, and
an orthogonal projection of the first groove onto the second base substrate covers the first notch.

5. The display module according to claim 2, further comprising:
a flexible circuit board bonded on the first extending portion; and
an integrated circuit chip disposed on the flexible circuit board.

6. The display module according to claim 5, wherein:
along the second direction, the first recessed portion is disposed at a middle of the first border region.

7. The display module according to claim 6, wherein:
along the second direction, the flexible circuit board includes a second notch located at a middle of the flexible circuit board and first connection portions located at both sides of the second notch;
along the first direction, the second notch is arranged opposite to the first groove; and
the first connection portions are bonded on the first extending portion.

8. The display module according to claim 5, wherein:
along the second direction, the first recessed portion is disposed at one end of the first border region.

9. The display module according to claim 8, wherein:
the flexible circuit board further comprises a second connection portion extending along the second direction;
the second connection portion is a continuous portion; and
the second connection portion is bonded on the first extending portion.

10. The display module according to claim 2, wherein:
the second border region further comprises a second recessed region recessed towards the display region, and a second extending portion extending along the second direction,
wherein:

the display region has a first side adjacent to the second border region and an opposing second side far away from the second border region, the second recessed region forms a second groove at the first side of the display region, and the through hole is disposed in the second groove.

11. The display module according to claim 10, further comprising:

a flexible circuit board bonded on the second extending portion; and an integrated circuit chip disposed on the flexible circuit board.

12. The display module according to claim 11, wherein:

along the second direction, the second recessed portion is indisposed at a middle of the second border region.

13. The display module according to claim 12, wherein:

along the second direction, the flexible circuit board further comprises a third notch located in a middle of the flexible circuit board, and third connection portions located at both sides of the third notch, wherein:

along the first direction, the third notch is arranged opposite to the second notch, and the third connection portions are bonded to the second extending portion.

14. The display module according to claim 11, wherein:

along the second direction, the second recessed portion is disposed at one end of the second border region.

15. The display module according to claim 14, wherein:

the flexible circuit board comprises a fourth connection portion extending along the second direction, the fourth connection portion is a continuous portion, and the fourth connection portion is bonded on the second extending portion.

16. The display module according to claim 2, wherein:

the through hole is enclosed by the display region.

17. The display module according to claim 2, wherein:

the display panel is a liquid crystal display panel;

the first base substrate is one of an array substrate and a color film substrate; and the second base substrate is a remained one of the array substrate and the color film substrate.

18. The display module according to claim 2, wherein:

the display panel is an organic light-emitting display panel;

the first base substrate is one of an array substrate and an encapsulation cover plate; and the second base substrate is a remained one of the array substrate and the encapsulation cover plate.

19. A display apparatus, comprising:

a display module, wherein the display module comprises:

a display panel, a fingerprint identification module, and a first function module, wherein the display panel including a display region and a border region surrounding the display region, wherein:

the border region includes a first border region and a second border region arranged opposite to the first border region along a first direction, the first border region includes a first recessed portion recessed towards the display region and a first extending portion extending along a second direction, and the display region includes a first side adjacent to the first border region and an opposing second side far away from the first border region, and the first recessed portion forms a first groove at the first side of the display region, a fingerprint identification module, and a first function module including at least one of a camera module and a headphone module, wherein:

the display panel includes a first base substrate and a second base substrate arranged opposite to the first base substrate along a third direction, the first base substrate includes a fingerprint region and a pixel region, an orthogonal projection of the first groove onto the first base substrate covers the fingerprint region, and an orthogonal projection of the display region onto the first base substrate overlaps with the pixel region, and the display panel includes a through hole penetrating the display panel along the third direction, and the first function module is disposed in the through hole.

20. The display apparatus according to claim 19, wherein:

the first direction crosses the second direction, and the first direction and the second direction are both parallel to a plane where the display panel is located;

the third direction is perpendicular to both the first direction and the second direction; and the fingerprint identification module includes a plurality of fingerprint identification sensors disposed in the fingerprint region.

* * * * *